United States Patent
Suzuki et al.

(10) Patent No.: US 9,786,742 B2
(45) Date of Patent: Oct. 10, 2017

(54) SEMICONDUCTOR DEVICE

(71) Applicant: Kabushiki Kaisha Toshiba, Minato-ku, Tokyo (JP)

(72) Inventors: Takuma Suzuki, Himeji Hyogo (JP); Hiroshi Kono, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/067,438

(22) Filed: Mar. 11, 2016

(65) Prior Publication Data
US 2017/0077237 A1 Mar. 16, 2017

(30) Foreign Application Priority Data
Sep. 11, 2015 (JP) .................. 2015-179328

(51) Int. Cl.
| H01L 29/16 | (2006.01) |
| H01L 29/08 | (2006.01) |
| H01L 29/10 | (2006.01) |
| H01L 29/30 | (2006.01) |
| H01L 29/739 | (2006.01) |
| H01L 29/78 | (2006.01) |

(52) U.S. Cl.
CPC ........ *H01L 29/1608* (2013.01); *H01L 29/086* (2013.01); *H01L 29/0865* (2013.01); *H01L 29/0878* (2013.01); *H01L 29/0882* (2013.01); *H01L 29/1037* (2013.01); *H01L 29/30* (2013.01); *H01L 29/7395* (2013.01); *H01L 29/7802* (2013.01)

(58) Field of Classification Search
None
See application file for complete search history.

(56) References Cited

U.S. PATENT DOCUMENTS

| 8,835,934 B2 | 9/2014 | Mizukami | |
| 2008/0079079 A1* | 4/2008 | Noguchi | H01L 27/0255 257/355 |
| 2009/0085111 A1* | 4/2009 | Sayama | H01L 29/0634 257/341 |
| 2010/0081243 A1 | 4/2010 | Kono et al. | |

(Continued)

FOREIGN PATENT DOCUMENTS

JP 2013-093440 A 5/2013

OTHER PUBLICATIONS

J.Y. Chen, "CMOS Devices and Technology for FLSI" (1990).

(Continued)

*Primary Examiner* — Khaja Ahmad
(74) *Attorney, Agent, or Firm* — White & Case LLP

(57) ABSTRACT

A semiconductor device according to an embodiment includes a SiC layer having a first plane and a second plane, a gate insulating film provided on the first plane, a gate electrode provided on the gate insulating film, a first SiC region of a first conductivity type provided in the SiC layer, a second SiC region of a second conductivity type provided in the first SiC region, a third SiC region of the first conductivity type provided in the second SiC region, and a fourth SiC region of the first conductivity type provided between the second SiC region and the gate insulating film, the fourth SiC region interposed between the second SiC regions, and the fourth SiC region provided between the first SiC region and the third SiC region.

20 Claims, 7 Drawing Sheets

(56) References Cited

U.S. PATENT DOCUMENTS

2011/0012132 A1*  1/2011  Otsuka ................ H01L 29/1095
                                                        257/77
2011/0198616 A1*  8/2011  Yamashita ............ H01L 21/047
                                                        257/77
2013/0234161 A1    9/2013  Shimizu et al.

OTHER PUBLICATIONS

Taiwanese Office Action dated Oct. 11, 2016 in corresponding Taiwanese Application No. 105102381, along with English translation thereof.

* cited by examiner

SEMICONDUCTOR DEVICE

CROSS-REFERENCE TO RELATED APPLICATION

This application is based upon and claims the benefit of priority from Japanese Patent Application No. 2015-179328, filed on Sep. 11, 2015, the entire contents of which are incorporated herein by reference.

FIELD

Embodiments described herein relate generally to semiconductor devices.

BACKGROUND

Silicon carbide (SiC) is expected to be used as a material for a next-generation semiconductor device. SiC has the following excellent physical properties: a band gap is three times wider than that of silicon (Si); breakdown field strength is about ten times more than that of Si; and thermal conductivity is about three times more than that of Si. The use of these characteristics makes it possible to achieve a semiconductor device which has low power consumption and can operate at a high temperature.

A metal oxide semiconductor field effect transistor (MOSFET) using SiC has a problem that the carrier mobility of a channel is lower than that in a MOSFET using Si.

DETAILED DESCRIPTION

Figure 1:
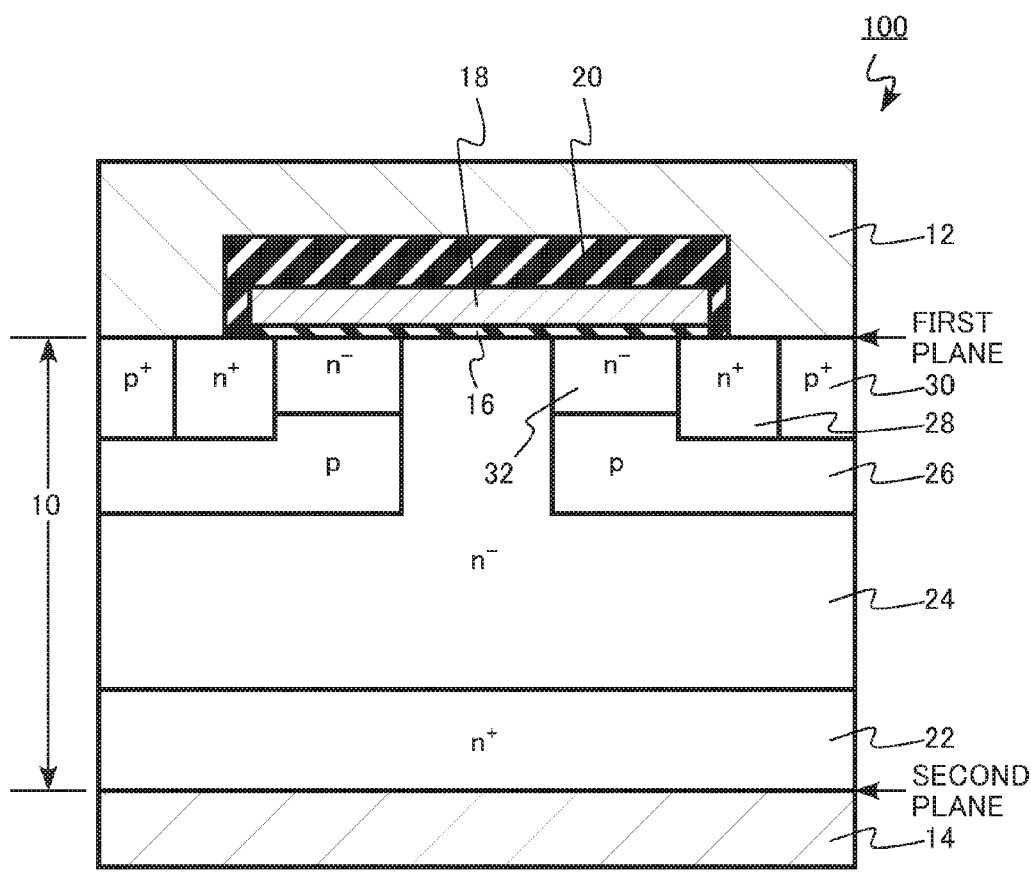
FIG. 1 is a cross-sectional view schematically illustrating a semiconductor device according to a first embodiment.

A semiconductor device according to an embodiment includes: a SiC layer having a first plane and a second plane; a gate insulating film provided on the first plane; a gate electrode provided on the gate insulating film; a first SiC region of a first conductivity type provided in the SiC layer, and the first SiC region having a portion in contact with the first plane; a second SiC region of a second conductivity type provided in the SiC layer, a part of the second SiC region provided between the first SiC region and the first plane, and a part of the second SiC region being in contact with the first plane; a third SiC region of the first conductivity type provided in the SiC layer, a part of the third SiC region provided between the second SiC region and the first plane, and a part of the third SiC region being in contact with the first plane; and a fourth SiC region of the first conductivity type provided in the SiC layer, the fourth SiC region provided between the second SiC region and the gate insulating film, the fourth SiC region interposed between the second SiC regions in the first plane, and the fourth SiC region provided between the first SiC region and the third SiC region in the first plane.

Hereinafter, embodiments of the invention will be described with reference to the drawings. In the following description, for example, the same or similar members are denoted by the same reference numerals and the description thereof will not be repeated.

In the following description, $n^{++}$, $n^+$, $n$, $n^-$, $p^{++}$, $p^+$, $p$, and $p^-$ indicate the relative impurity concentrations of each conductivity type. That is, $n^{++}$ indicates n-type impurity concentration that is relatively higher than that of $n^+$, $n^+$ indicates n-type impurity concentration that is relatively higher than that of n, and $n^-$ indicates n-type impurity concentration that is relatively lower than that of n. In addition, $p^{++}$ indicates p-type impurity concentration that is relatively higher than that of $p^+$, $p^+$ indicates p-type impurity concentration that is relatively higher than that of p, and $p^-$ indicates p-type impurity concentration that is relatively lower than that of p. In some cases, an $n^{++}$ type, an $n^+$ type, and an $n^-$ type are simply referred to as an n type, and a $p^{++}$ type, a $p^+$ type, and a $p^-$ type are simply referred to as a p type.

First Embodiment

A semiconductor device according to a first embodiment includes: a SiC layer having a first plane and a second plane; a gate insulating film provided on the first plane; a gate electrode provided on the gate insulating film; a first SiC region of a first conductivity type which is provided in the SiC layer and has a portion provided in the first plane; a second SiC region of a second conductivity type which is provided in the first SiC region and has a portion provided in the first plane; a third SiC region of the first conductivity type which is provided in the second SiC region and has a portion provided in the first plane; and a fourth SiC region of the first conductivity type which is provided between the second SiC region and the gate insulating film, is interposed between the second SiC regions in the first plane, and is provided between the first SiC region and the third SiC region in the first plane.

Figure 2:
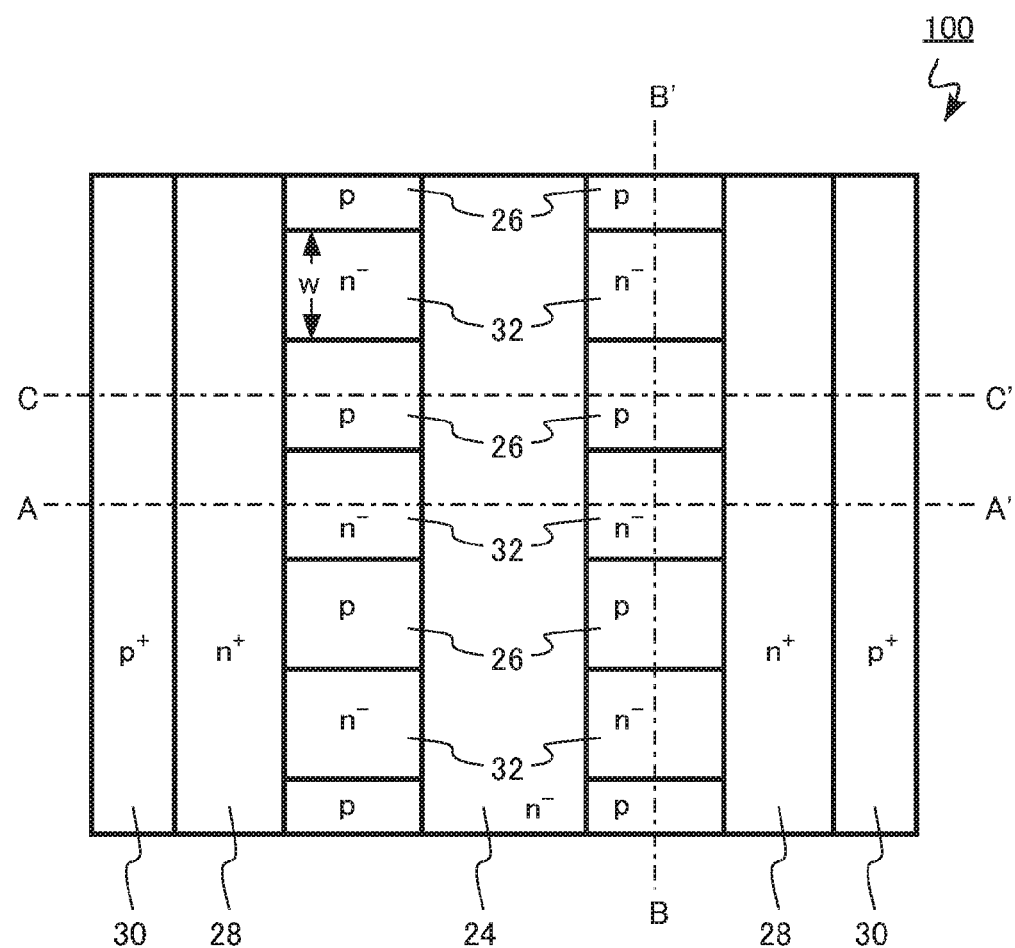
FIG. 2 is a plan view schematically illustrating the semiconductor device according to the first embodiment.
Figure 3:
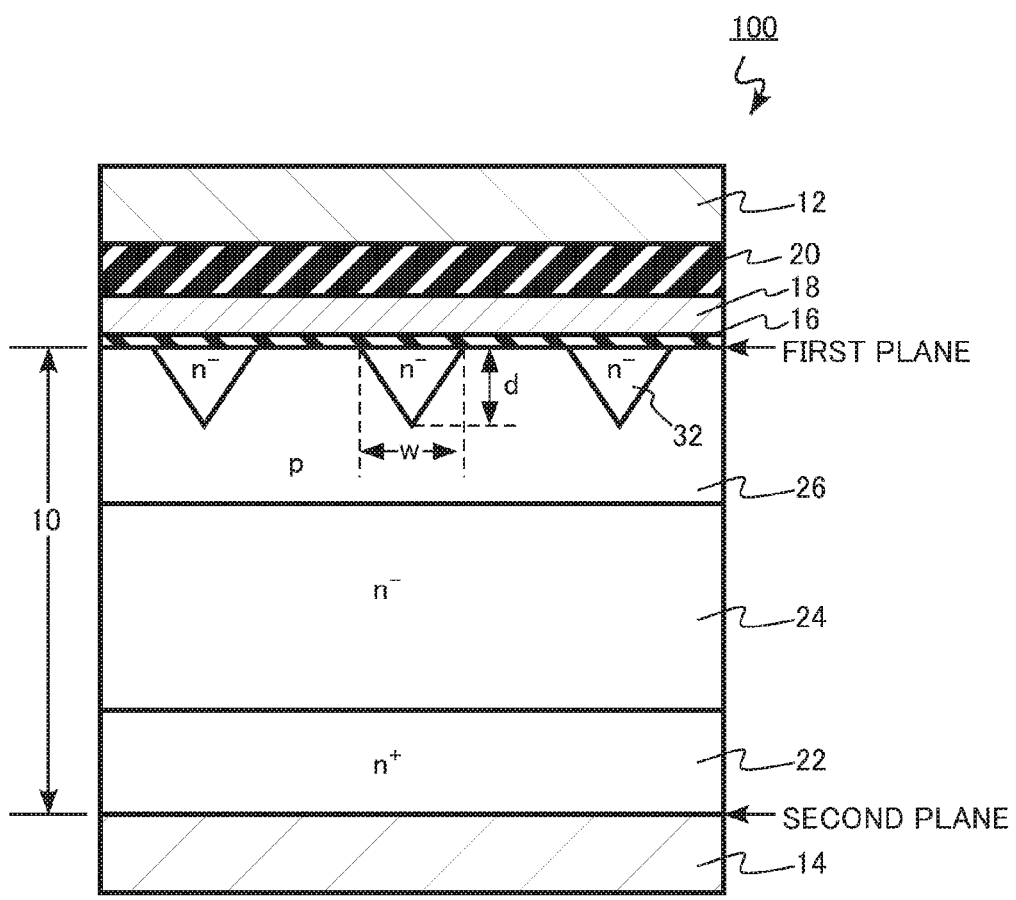
FIG. 3 is a cross-sectional view schematically illustrating the semiconductor device according to the first embodiment.
Figure 4:
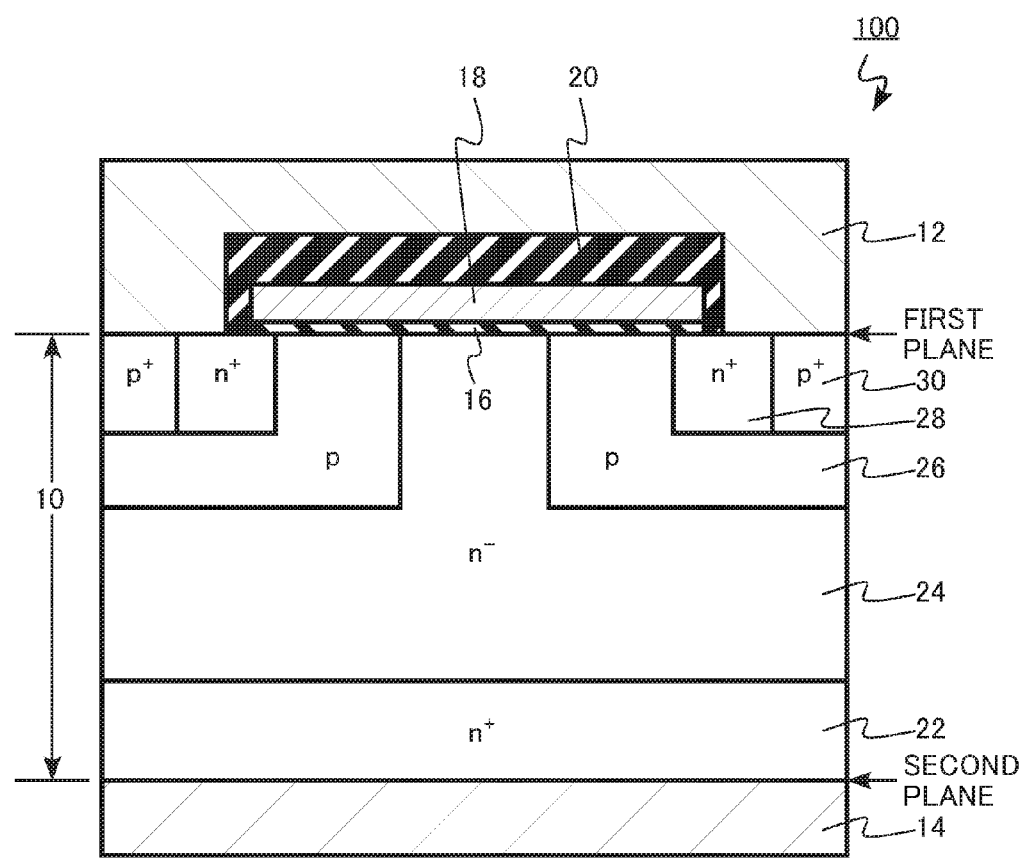
FIG. 4 is a cross-sectional view schematically illustrating the semiconductor device according to the first embodiment.

FIGS. 1, 3, and 4 are cross-sectional views schematically illustrating the structure of a MOSFET which is the semiconductor device according to this embodiment. FIG. 2 is a plan view schematically illustrating the structure of the MOSFET which is the semiconductor device according to this embodiment. FIG. 1 is a cross-sectional view taken along the line A-A' of FIG. 2. FIG. 3 is a cross-sectional view taken along the line B-B' of FIG. 2. FIG. 4 is a cross-sectional view taken along the line C-C' of FIG. 2.

A MOSFET 100 according to this embodiment is, for example, a double implantation MOSFET (DIMOSFET) in which a base region (body region) and a source region are formed by ion implantation. The MOSFET 100 is a vertical n-channel MOSFET having electrons as carriers.

The MOSFET 100 includes a SiC layer 10, a source electrode 12, a drain electrode 14, a gate insulating film 16, a gate electrode 18, and an interlayer insulating film 20. The SiC layer 10 includes an $n^+$-type drain region 22, an $n^-$-type drift region (first SiC region) 24, a p-type base region (second SiC region) 26, an n+-type source region (third SiC region) 28, a p−-type base contact region 30, and an n−-type front surface region (fourth SiC region) 32.

The SiC layer 10 is a single crystal SiC layer. The SiC layer 10 is, for example, a 4H-SiC layer.

The SiC layer 10 has a first plane and a second plane. Hereinafter, the first plane is also referred to as a front surface and the second plane is also referred to as a rear surface.

For example, the first plane is inclined at an angle that is equal to or greater than 0° and equal to or less than 8° with respect to the (0001) face. For example, the second plane is inclined at an angle that is equal to or greater than 0° and equal to or less than 8° with respect to the (000-1) face. The (0001) face is referred to as a silicon face. The (000-1) face is referred to as a carbon face.

The n+-type drain region 22 is provided on the rear surface of the SiC layer 10. The drain region 22 includes, for example, nitrogen (N) as n-type impurities. The n-type impurity concentration of the drain region 22 is, for example, equal to or greater than $1\times10^{18}$ cm$^{-3}$ and equal to or less than $1\times10^{21}$ cm$^{-3}$.

The n−-type drift region 24 is provided on the drain region 22. For example, at least a portion of the drift region 24 is provided in the front surface of the SiC layer 10. For example, other SiC regions may be provided between the drift region 24 and the front surface of the SiC layer 10.

The drift region 24 includes, for example, nitrogen (N) as n-type impurities. The n-type impurity concentration of the drift region 24 is, for example, equal to or greater than $5\times10^{15}$ cm$^{-3}$ and equal to or less than $5\times10^{16}$ cm$^{-3}$. The thickness of the drift region 24 is, for example, equal to or greater than 4 μm and equal to or less than 150 μm.

The p-type base region 26 is provided in the drift region 24. For example, at least a portion of the base region 26 is provided in the front surface of the SiC layer 10. For example, other SiC regions may be provided between the base region 26 and the front surface of the SiC layer 10.

The base region 26 includes, for example, aluminum (Al) as p-type impurities. The p-type impurity concentration of the base region 26 is, for example, equal to or greater than $5\times10^{15}$ cm$^{-3}$ and equal to or less than $1\times10^{19}$ cm$^{-3}$. The depth of the base region 26 is, for example, equal to or greater than 0.4 μm and equal to or less than 0.8 μm.

The n+-type source region 28 is provided in the base region 26. For example, at least a portion of the source region 28 is provided in the front surface of the SiC layer 10. For example, other SiC regions may be provided between the source region 28 and the front surface of the SiC layer 10.

The source region 28 includes, for example, phosphor (P) as n-type impurities. The n-type impurity concentration of the source region 28 is, for example, equal to or greater than $1\times10^{18}$ cm$^{-3}$ and equal to or less than $1\times10^{21}$ cm$^{-3}$. The depth of the source region 28 is less than the depth of the base region 26 and is, for example, equal to or greater than 0.2 μm and equal to or less than 0.4 μm.

The p+-type base contact region 30 is provided in the base region 26. The base contact region 30 is provided so as to come into contact with the source region 28.

The base contact region 30 includes, for example, aluminum (Al) as p-type impurities. The p-type impurity concentration of the base contact region 30 is, for example, equal to or greater than $1\times10^{18}$ cm$^{-3}$ and equal to or less than $1\times10^{21}$ cm$^{-3}$.

The depth of the base contact region 30 is less than the depth of the base region 26 and is, for example, equal to or greater than 0.2 μm and equal to or less than 0.4 μm.

The n−-type front surface region 32 is provided between the base region 26 and the gate insulating film 16. For example, the front surface region 32 is interposed between the base regions 26 in the front surface of the SiC layer 10. The front surface region 32 and the base region 26 are alternately formed in the front surface of the SiC layer 10. For example, other SiC regions may be provided between the n−-type front surface region 32 and the front surface of the SiC layer 10.

In addition, the front surface region 32 is interposed between the drift region 24 and the source region 28 in the front surface of the SiC layer 10. The front surface region 32 comes into contact with the source region 28 in the front surface of the SiC layer 10. The base region 26 is also interposed between the drift region 24 and the source region 28 in the front surface of the SiC layer 10.

The front surface region 32 includes, for example, nitrogen (N) as n-type impurities. The n-type impurity concentration of the front surface region 32 is lower than the n-type impurity concentration of the source region 28. The n-type impurity concentration of the front surface region 32 is, for example, equal to or greater than $5\times10^{15}$ cm$^{-3}$ and equal to or less than $5\times10^{16}$ cm$^{-3}$.

The width ("w" in FIGS. 2 and 3) of the front surface region 32 in the front surface of the SiC layer 10 is, for example, equal to or greater than 0.05 μm and equal to or less than 2.0 μm.

The depth of the front surface region 32 is less than the depth of the source region 28 and is, for example, equal to or greater than 0.05 μm and equal to or less than 0.15 μm.

The gate insulating film 16 is provided on the front surface of the SiC layer 10. The gate insulating film 16 is provided on the drift region 24, the base region 26, the source region 28, and the front surface region 32. The gate insulating film 16 is, for example, a silicon oxide film. For example, a high-k insulating film (high-permittivity insulating film) can be applied as the gate insulating film 16.

The gate electrode 18 is provided on the gate insulating film 16. The gate electrode 18 is a conductive layer. The gate electrode 18 is, for example, a polysilicon film including p-type impurities or n-type impurities.

The interlayer insulating film 20 is provided on the gate electrode 18. The interlayer insulating film 20 is, for example, a silicon oxide film.

The front surface region 32 which is interposed between the source region 28 and the drift region 24 below the gate electrode 18 functions as a channel region of the MOSFET 100.

The source electrode 12 is provided on the front surface of the SiC layer 10. The source electrode 12 is electrically connected to the source region 28 and the base contact region 30. The source electrode 12 comes into contact with the source region 28 and the base contact region 30. The source electrode 12 also has a function of applying potential to the base region 26.

The source electrode 12 includes metal. Metal forming the source electrode 12 has, for example, a stacked structure of titanium (Ti) and aluminum (Al). The source electrode 12 may include metal silicide or metal carbide which comes into contact with the SiC layer 10.

The drain electrode 14 is provided on the rear surface of the SiC layer 10. The drain electrode 14 is electrically connected to the drain region 22.

The drain electrode 14 is made of, for example, metal. The metal forming the drain electrode 14 has, for example, a stacked structure of nickel (Ni) and gold (Au). The drain electrode 14 may include metal silicide or metal carbide which comes into contact with the rear surface of the SiC layer 10.

Next, a method for manufacturing the MOSFET 100 according to this embodiment will be described. In particular, a method for forming the front surface region 32 will be described.

Figure 5:
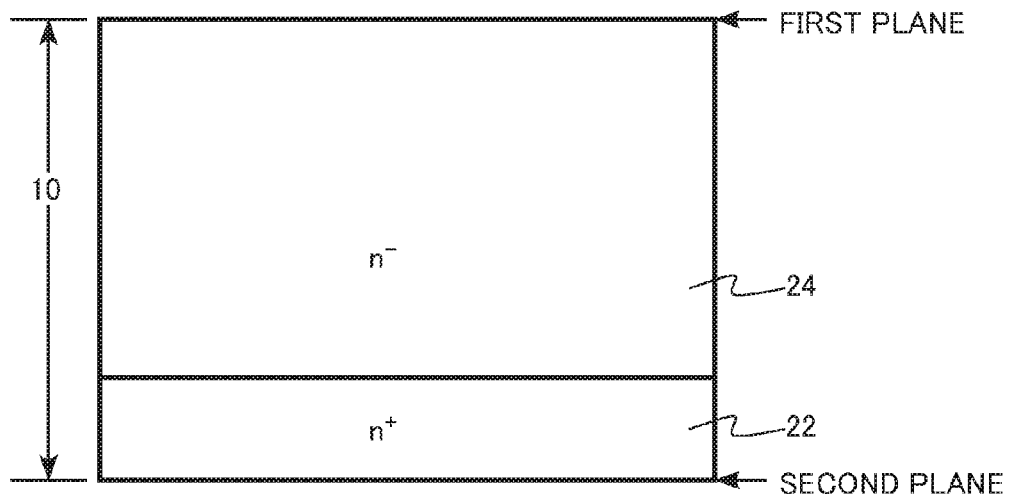
FIG. 5 is a cross-sectional view schematically illustrating the semiconductor device which is being manufactured in a semiconductor device manufacturing method according to the first embodiment.
Figure 6:
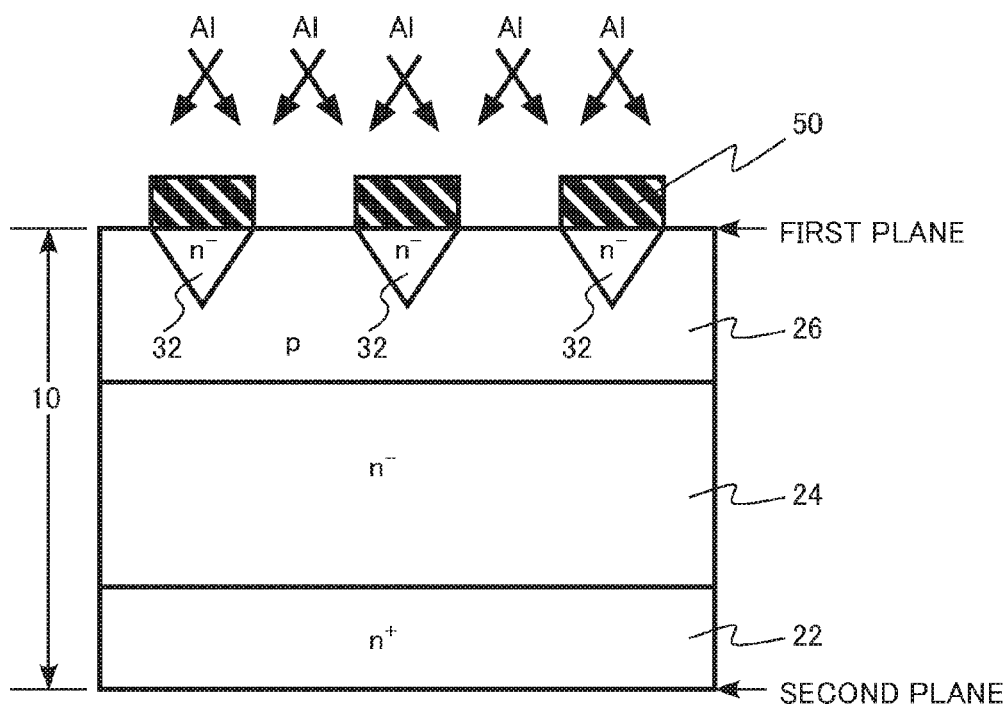
FIG. 6 is a cross-sectional view schematically illustrating the semiconductor device which is being manufactured in the semiconductor device manufacturing method according to the first embodiment.

FIGS. 5 and 6 are cross-sectional views schematically illustrating the semiconductor device which is being manufactured in the semiconductor device manufacturing method according to this embodiment.

The drift region 24 is formed on the drain region 22 by epitaxial growth (FIG. 5).

Then, a mask member 50 is formed on the front surface of the drift region 24. The mask member 50 is a silicon oxide film which is formed by, for example, a chemical vapor deposition (CVD) method.

Then, aluminum (Al) ions, which are p-type impurity ions, are implanted into the drift region 24, using the mask member 50 as a mask (FIG. 6). The base region 26 is formed by the ion implantation.

The aluminum ions are implanted by, for example, oblique ion implantation. No aluminum is introduced into a region covered with the mask member 50 and the base region 26 is not formed in the region. In other words, a portion of the drift region 24 which is covered with the mask member 50 remains, without being removed, and the front surface region 32 is formed in the remaining portion. As a result, the n-type impurity concentration of the front surface region 32 is substantially equal to the n-type impurity concentration of the drift region 24.

Then, the mask member 50 is removed. Then, the $n^+$-type source region 28, the $p^+$-type base contact region 30, the gate insulating film 16, the gate electrode 18, the interlayer insulating film 20, the source electrode 12, and the drain electrode 14 are formed by a known process. In this way, the MOSFET 100 is manufactured.

Next, the function and effect of the semiconductor device according to the embodiment will be described.

The MOSFET using SiC has a problem that the mobility of carriers is lower than that in a MOSFET using Si. It is considered that one of the causes of the problem is the formation of a channel in the impurity region formed in the SiC layer.

For example, the crystallinity (translation symmetry) of SiC is disrupted by ion implantation and the mobility of carriers is reduced. In addition, the mobility of carriers is reduced by Coulomb scattering caused by charge which is trapped in crystal defects that generated in the SiC layer due to ion implantation. Furthermore, the mobility of carriers is reduced by roughness scattering caused by the unevenness of the front surface of the SiC layer which occurs due to ion implantation.

In the MOSFET 100 according to this embodiment, a channel is formed in the front surface region 32 into which no impurity ions are implanted. Therefore, the disruption of crystallinity, Coulomb scattering, or roughness scattering caused by ion implantation does not occur. As a result, the mobility of carriers is improved.

During the turn-off operation of the MOSFET 100 according to this embodiment, the front surface region 32 is completely depleted and the MOSFET 100 is turned off.

When the width ("w" in FIGS. 2 and 3) of the front surface region 32 interposed between the base regions 26 in the front surface of the SiC layer 10 is w [μm], the p-type impurity concentration of the base region 26 is $N_A$ [cm$^{-3}$], the n-type impurity concentration of the front surface region 32 is $N_D$ [cm$^{-3}$], built-in potential (Vbi) is 3.2 [V], an elementary charge (q) is 1.602×10$^{-19}$ [C], the specific permittivity of vacuum ($\varepsilon_0$) is 8.854×10$^{-14}$ [F/cm], and the specific permittivity of SiC ($\varepsilon$) is 9.7, it is preferable that the following inequality be satisfied in order to completely deplete the front surface region 32:

$$w \leq 2 \times 10000 \times \sqrt{\frac{2\varepsilon_0 \varepsilon \cdot V_{bi}}{q} \frac{N_A + N_D}{N_A N_D}}.$$

For example, when other SiC regions are provided between the $n^-$-type front surface region 32 and the SiC layer 10, w is the width of a portion of the $n^-$-type front surface region 32 which is close to the front surface of the SiC layer 10.

When the above-mentioned inequality is satisfied, the front surface region 32 is completely depleted by depletion layers which are spread from both sides of the front surface region 32.

For example, when $N_A$ is changed in the range of 5×10$^{15}$ [cm$^{-3}$] to 5×10$^6$ [cm$^{-3}$] and $N_D$ is changed in the range of 5×10$^{15}$ [cm$^{-3}$] to 5×10$^{16}$ [cm$^{-3}$], the maximum value of w is 1.6 μm. At that time, $N_A$ is 5×10$^{16}$ [cm$^{-3}$] and $N_D$ is 5×10$^{15}$ [cm$^{-3}$]. Therefore, it is preferable that the width of the front surface region 32 interposed between the base regions 26 in the front surface of the SiC layer 10 be equal to or less than 1.6 μm.

In addition, it is preferable that the width of the front surface region 32 interposed between the base regions 26 be gradually reduced in a direction from the front surface to the rear surface of the SiC layer 10 in order to completely deplete the front surface region 32 during the turn-off operation of the MOSFET 100. For example, as illustrated in FIG. 3, it is preferable that the front surface region 32 have an inverted triangle shape. Since the width of the front surface region 32 is gradually reduced in the depth direction, the depletion layers which are spread from both sides of the front surface region 32 are likely to be blocked.

It is preferable that the width ("w" in FIG. 3) of the front surface region 32 interposed between the base regions 26 in the front surface of the SiC layer 10 be less than the depth ("d" in FIG. 3) of the front surface region 32 interposed between the base regions 26 from the front surface of the SiC layer 10, in order to completely deplete the front surface region 32. Since the width of the front surface region 32 in the front surface of the SiC layer 10 is less than the depth thereof, the front surface region 32 is likely to be blocked by the depletion layers which are spread from both sides of the front surface region 32.

It is preferable that the density of crystal defects in the front surface region 32 be lower than the density of crystal defects in the base region 26. The Coulomb scattering of carriers due to crystal defects is suppressed and the mobility of carriers is improved. According to the manufacturing method of this embodiment, it is possible to reduce the density of crystal defects in the front surface region 32.

The impurity concentration of the front surface region 32 and the base region 26 can be measured by, for example, secondary ion mass spectrometry (SIMS). In addition, the width or depth of the front surface region 32 can be measured by, for example, scanning capacitance microscopy (SCM). The magnitude relationship between the impurity concentrations of the front surface region 32 and the drift region 24 can be determined by, for example, SCM.

The magnitude relationship between the densities of crystal defects in the front surface region 32 and the base region 26 can be determined by, for example, a transmission electron microscope (TEM) method.

In the MOSFET 100 according to this embodiment, the front surface region 32 with high carrier mobility can be formed at the same time as the base region 26. Therefore, it is possible to easily manufacture the MOSFET 100 according to this embodiment.

As described above, according to the MOSFET 100 of this embodiment, it is possible to improve the carrier mobility of a channel.

Second Embodiment

A semiconductor device according to a second embodiment is similar to the semiconductor device according to the first embodiment except that the second SiC region is provided between the fourth SiC region and the third SiC region in the first plane. Therefore, the description of the same content as that in the first embodiment will not be repeated.

Figure 7:
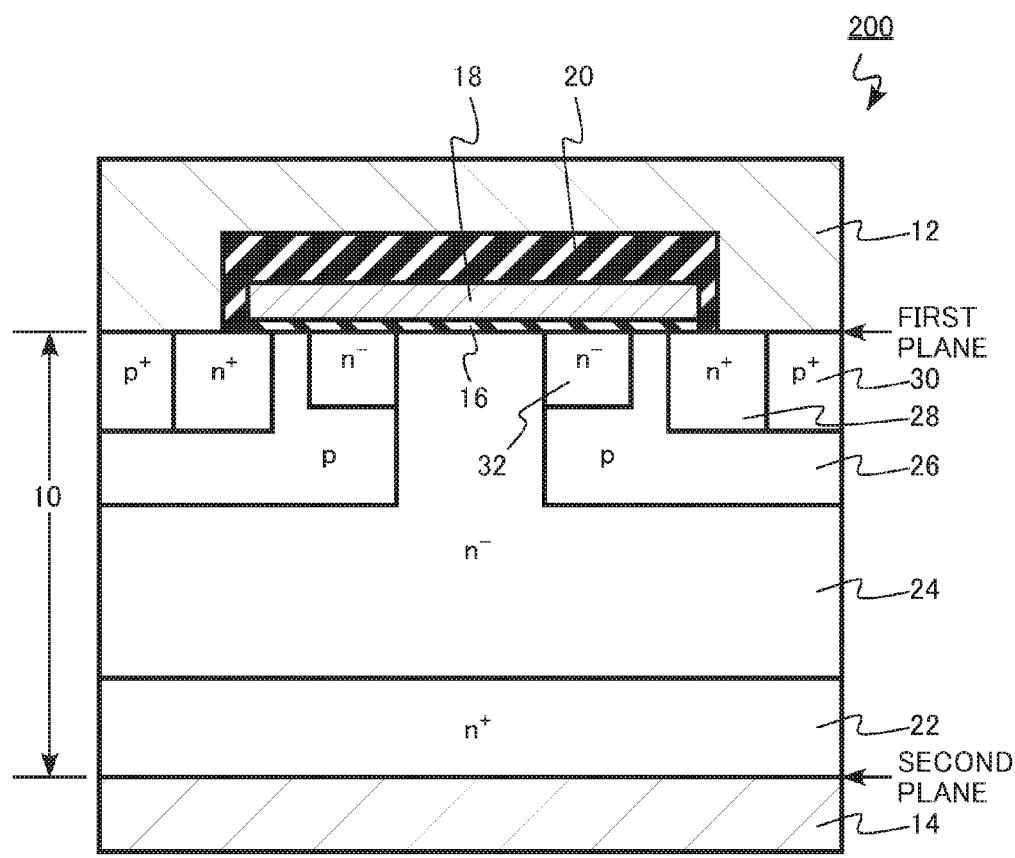
FIG. 7 is a cross-sectional view schematically illustrating a semiconductor device according to a second embodiment.
Figure 8:
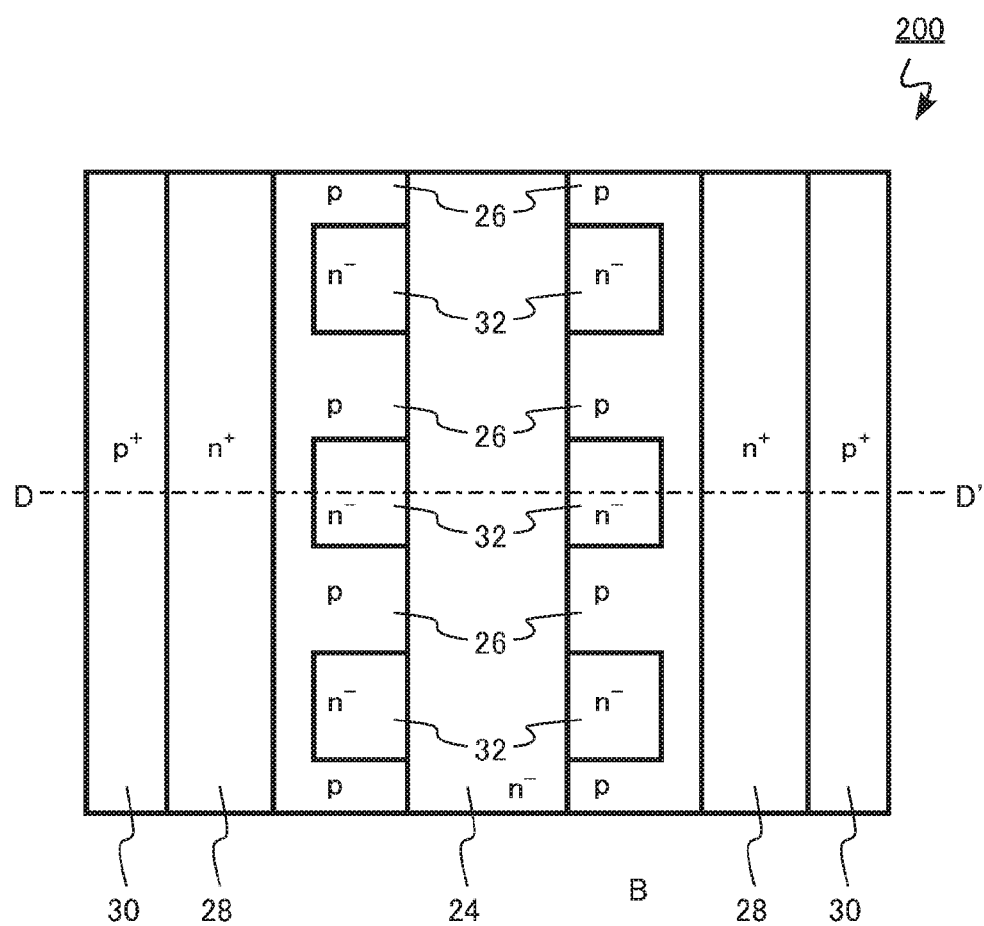
FIG. 8 is a plan view schematically illustrating the semiconductor device according to the second embodiment.

FIG. 7 is a cross-sectional view schematically illustrating the structure of a MOSFET which is the semiconductor device according to this embodiment. FIG. 8 is a plan view schematically illustrating the structure of the MOSFET which is the semiconductor device according to this embodiment. FIG. 7 is a cross-sectional view taken along the line D-D' of FIG. 8.

A MOSFET 200 according to this embodiment is a DIMOSFET. The MOSFET 200 is a vertical n-channel MOSFET having electrons as carriers.

In the MOSFET 200, a base region 26 is provided between a front surface region 32 and a source region 28 in the front surface of a SiC layer 10. When the p-type base region 26 is provided, cutoff characteristics during the turn-off operation of the MOSFET 200 are improved, as compared to a case in which the p-type base region 26 is not provided.

According to the MOSFET 200 of this embodiment, the carrier mobility of a channel can be improved by the same function as that in the first embodiment. In addition, the cutoff characteristics during the turn-off operation of the MOSFET 200 are improved.

In the first and second embodiments, the 4H-SiC substrate is used as the SiC substrate. However, other crystal forms, such as 3C-SiC and 6H-SiC, may be used.

In the first and second embodiments, nitrogen (N) and phosphor (P) are given as examples of the n-type impurities. However, for example, arsenic (As) and antimony (Sb) may be used as the n-type impurities. In addition, aluminum (Al) is given as an example of the p-type impurities. However, boron (B) may be used.

In the first and second embodiments, the vertical MOSFET is given as an example of the semiconductor device. However, the invention is not limited to the vertical MOSFET. The invention can be applied to other semiconductor devices including transistors having a metal insulator semiconductor (MIS) structure. For example, the invention can also be applied to a horizontal MOSFET. In addition, for example, the invention can be applied to a vertical insulated gate bipolar transistor (IGBT).

In the first and second embodiments, the first conductivity type is an n type and the second conductivity type is a p type. However, the first conductivity type may be a p type and the second conductivity type may be an n type. In this case, the transistor is a p-channel transistor having holes as carriers.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a SiC layer having a first plane and a second plane;
a gate insulating film provided on the first plane;
a gate electrode provided on the gate insulating film;
a first SiC region of a first conductivity type provided in the SiC layer, and the first SiC region having a portion in contact with the first plane;
a second SiC region of a second conductivity type provided in the SiC layer, the second SiC region provided between the first plane and the first SiC region, the second SiC region having a first part and a second part, the second part being in contact with the first plane, the first part being adjacent to the second part in a first direction, the first direction being parallel to the first plane;
a third SiC region of the first conductivity type provided in the SiC layer, the third SiC region provided between the second SiC region and the first plane, and a part of the third SiC region being in contact with the first plane; and
a fourth SiC region of the first conductivity type provided in the SiC layer, the fourth SiC region provided between the first part of the second SiC region and the gate insulating film, the fourth SiC region being adjacent to the second part of the second SiC region in the first direction in the first plane, the fourth SiC region provided between the first SiC region and the third SiC region in a second direction in the first plane, the second direction being perpendicular to the first direction and being parallel to the first plane, and first-conductivity-type impurity concentration of the fourth SiC region is lower than first-conductivity-type impurity concentration of the third SiC region.

2. The semiconductor device according to claim 1, wherein the fourth SiC region and the third SiC region are in contact with each other in the first plane.

3. The semiconductor device according to claim 1, wherein width of the fourth SiC region interposed between the second SiC regions is gradually reduced in a direction from the first plane to the second plane.

4. The semiconductor device according to claim 1, wherein the second SiC region is provided between the fourth SiC region and the third SiC region in the first plane.

5. The semiconductor device according to claim 1, wherein, when width of the fourth SiC region interposed between the second SiC regions in the first plane is w [μm], the second-conductivity-type impurity concentration of the second SiC region is $N_A$ [cm$^3$], the first-conductivity-type impurity concentration of the fourth SiC region is $N_D$ [cm$^{-3}$], Vbi is 3.2 [V], q is $1.602 \times 10^{-19}$ [C], $\epsilon_0$ is $8.854 \times 10^{-14}$ [F/cm], and $\epsilon$ is 9.7, the following inequality is satisfied:

$$w \leq 2 \times 10000 \times \sqrt{\frac{2\varepsilon_0 \varepsilon \cdot V_{bi}}{q} \frac{N_A + N_D}{N_A N_D}}.$$

6. The semiconductor device according to claim 1,
wherein the width of the fourth SiC region in the first direction is equal to or less than 1.6 μm.

7. The semiconductor device according to claim 1,
wherein density of crystal defects in the fourth SiC region is lower than density of crystal defects in the second SiC region.

8. The semiconductor device according to claim 1,
wherein width of the fourth SiC region in the first direction is less than depth of the fourth SiC.

9. The semiconductor device according to claim 1,
wherein the first-conductivity-type impurity concentration of the fourth SiC region is substantially equal to the first-conductivity-type impurity concentration of the first SiC region.

10. The semiconductor device according to claim 1,
wherein the gate insulating film is a silicon oxide film.

11. A semiconductor device comprising:
a SiC layer having a first plane and a second plane;
a gate insulating film provided on the first plane;
a gate electrode provided on the gate insulating film;
a first SiC region of a first conductivity type provided in the SiC layer;
a second SiC region of a second conductivity type provided in the first SiC region, the second SiC region provided between the first plane and the first SiC region, the second SiC region having a first part and a second part, the second part being in contact with the first plane, the first part being adjacent to the second part in a first direction, the first direction being parallel to the first plane;
a third SiC region of the first conductivity type provided in the second SiC region; and
a fourth SiC region of the first conductivity type provided between the first part of the second SiC region and the gate insulating film, the fourth SiC region being adjacent to the second part of the second SiC region in the first direction, the fourth SiC region provided between the first SiC region and the third SiC region in a second direction, the second direction being perpendicular to the first direction and being parallel to the first plane, and first-conductivity-type impurity concentration of the fourth SiC region is lower than first-conductivity-type impurity concentration of the third SiC region.

12. The semiconductor device according to claim 11,
wherein the fourth SiC region and the third SiC region are in contact with each other.

13. The semiconductor device according to claim 11,
wherein width of the fourth SiC region interposed between the second SiC regions is gradually reduced in a direction from the first plane to the second plane.

14. The semiconductor device according to claim 11,
wherein the second SiC region is provided between the fourth SiC region and the third SiC region.

15. The semiconductor device according to claim 11,
wherein, when width of a portion close to the first plane in the fourth SiC region interposed between the second SiC regions is w [μm], the second-conductivity-type impurity concentration of the second SiC region is $N_A$ [cm$^3$], the first-conductivity-type impurity concentration of the fourth SiC region is $N_D$ [cm$^{-3}$], Vbi is 3.2 [V], q is 1.602×10$^{-19}$ [C], $\epsilon_0$ is 8.854×10$^{-14}$ [F/cm], and $\epsilon$ is 9.7, the following inequality is satisfied:

$$w \leq 2 \times 10000 \times \sqrt{\frac{2\varepsilon_0 \varepsilon \cdot V_{bi}}{q} \frac{N_A + N_D}{N_A N_D}}.$$

16. The semiconductor device according to claim 11,
wherein width of the fourth SiC region in the first direction is equal to or less than 1.6 μm.

17. The semiconductor device according to claim 11,
wherein density of crystal defects in the fourth SiC region is lower than density of crystal defects in the second SiC region.

18. The semiconductor device according to claim 11,
wherein width of the fourth SiC region in the first direction is less than depth of the fourth SiC region.

19. The semiconductor device according to claim 11,
wherein the first-conductivity-type impurity concentration of the fourth SiC region is substantially equal to the first-conductivity-type impurity concentration of the first SiC region.

20. The semiconductor device according to claim 11,
wherein the gate insulating film is a silicon oxide film.

* * * * *